United States Patent
Yoshida et al.

(10) Patent No.: US 7,126,362 B2
(45) Date of Patent: Oct. 24, 2006

(54) INSPECTION UNIT

(75) Inventors: Takuto Yoshida, Tokyo (JP); Atsushi Sato, Gunma (JP)

(73) Assignee: Yokowo Co., Ltd., Tokyo (JP)

( * ) Notice: Subject to any disclaimer, the term of this patent is extended or adjusted under 35 U.S.C. 154(b) by 0 days.

(21) Appl. No.: 11/238,054

(22) Filed: Sep. 29, 2005

(65) Prior Publication Data

US 2006/0066331 A1 Mar. 30, 2006

(30) Foreign Application Priority Data

Sep. 30, 2004 (JP) .......................... P2004-288231

(51) Int. Cl.
*G01R 31/02* (2006.01)

(52) U.S. Cl. .................................... 324/754

(58) Field of Classification Search ...................... None
See application file for complete search history.

(56) References Cited

U.S. PATENT DOCUMENTS 6,203,345 B1 * 3/2001 Roque et al. ............... 439/260
6,882,168 B1 * 4/2005 Root ........................... 324/754

FOREIGN PATENT DOCUMENTS

| JP | A-2001-099889 | 4/2001 |
| JP | A-2004-170182 | 6/2004 |
| JP | A-2004-325306 | 11/2004 |

* cited by examiner

*Primary Examiner*—Jermele Hollington
*Assistant Examiner*—Trung Q. Nguyen
(74) *Attorney, Agent, or Firm*—Morgan, Lewis & Bockius LLP

(57) ABSTRACT

A conductive member has a first face adapted to be mounted on a board on which an inspection circuit is arranged and a second face adapted to be opposed to a device to be inspected. The conductive member being formed with a first through hole having a first diameter and communicating the first face with the second face. A contact probe is provided with a tubular body having a second diameter which is smaller than the first diameter, and a plunger retractably projected from one end of the tubular body. A first retainer is formed with a second through hole and opposing at least the second face of the conductive member so as to communicate the first through hole with the second through hole, so that the contact probe is retained in the conductive member while only the plunger is projected from one end of the second through hole. A second retainer is adapted to retain the one end of the tubular body concentrically with the first through hole.

6 Claims, 6 Drawing Sheets

INSPECTION UNIT

BACKGROUND OF THE INVENTION

The present invention relates to an inspection unit for a high frequency/high-speed device for ensuring reliable connection between the inspection unit and the device to be inspected, on occasion of inspecting its electrical performance, before a module of a high frequency/high-speed circuit such as an amplifier circuit, a mixer circuit, a filter circuit, a memory, a CPU, etc. or an IC to be incorporated in a mobile phone, for example, has been assembled to a circuit board. In this specification, the term "high frequency" refers to an analogue signal having a high frequency (1 GHz or more), while the term "high-speed" refers to a digital signal having very short pulse width and pulse interval, and both of which are hereinafter collectively referred to as RF (radio frequency).

On occasion of inspecting electrical performance of the RF device such as a semi-conductor wafer, an IC, or a module, insufficient contacts between the terminals may particularly cause fluctuation of impedance or other measurement factors, which may sometimes vary to change measured values. Under the circumstances, such inspection has been conducted by a special inspection unit, for example, as shown in FIG. 4A (disclosed in Japanese Patent Publication No. 2001-99889A). In such an inspection, an RF circuit, which is the device to be inspected, is constructed in a form of a module 50 including an amplifier circuit and a mixer circuit, and is housed in a metal casing for avoiding interference with the exterior. The module 50 includes input and output terminals 51, 54 for RF signals, a power supply electrode terminal 52, and a grounding terminal 53, which are provided on a back face of the metal casing. Then, the inspection is conducted by electrically connecting the terminals to respective terminals of a wiring board 66 on which certain wirings for the inspection are arranged.

In the example as shown in FIG. 9A, there are employed contact probes each having a spring and a plunger contained in a metal pipe, one end of the plunger being adapted to be projected to the exterior by the spring and contracted when pushed. The respective electrode terminals are connected by contact probes 63 for RF signals, a contact probe 64 for power supply, and a contact probe 65 for grounding which are contained in a metal block 61 for preventing them from being affected by noises. Each of the contact probes 63 for RF signals is formed in a coaxial structure, using the contact probe as a core conductor and using an inner wall of a through hole in the metal block 61 as an outer conductor, especially for preventing intrusion of noises. In FIG. 9A, denoted with numeral 67 is a coaxial cable, and 68 is a plate for pressing the metal pipes surrounding the contact probes. Such a structure around the contact probes is almost the same in case of an IC socket for inspecting ICs, though such socket has a different outer shape.

Although FIG. 9A shows only two contact probes 63 for RF signals (for input and output), and one each contact probes 64, 65 each for power supply and for grounding, a large number of these contact probes are actually provided in the metal block 61. In the maximum case, the electrode terminals of about 600 pieces per 1 cm² are provided in a matrix manner with a narrow pitch of about 0.4 mm.

In such the narrow-pitch device, an outer diameter of the contact probe for RF signals including a dielectric layer must be reduced in size. Meanwhile, it is also necessary to adjust the impedance of the coaxial structure formed by the contact probe and the inner wall of the through hole to a predetermined characteristic impedance (50 Ω, for example) satisfying the following Equation (1).

$$Zo = \frac{60}{\sqrt{\varepsilon_r}} \log_e \frac{D}{d} \quad (1)$$

where, d is the outer diameter of the core conductor (the contact probe), D is the inner diameter of the outer conductor (the through hole), and $\varepsilon_r$ is a dielectric constant of the dielectric substance between them.

In order to satisfy the Equation (1), it is possible to reduce the inner diameter D of the outer conductor by providing a tube made from dielectric substance with small dielectric constant between each contact probe and each through hole. However, even though a tube of polytetrafuluoroethylene having dielectric constant of 2.1, which is the dielectric substance having the smallest dielectric constant available at present, is employed, and the contact probe having the smallest diameter available (having the outer diameter of 0.15 mm) is employed, the inner diameter of the outer conductor (the inner diameter of the through hole formed in the metal block) requires about 0.5 mm to obtain 50Ω as the characteristic impedance of the coaxial structure. This cannot attain the pitch of 0.4 mm.

For the purpose of solving the problem as described above, Japanese Patent Publication No. 2004-170182A discloses such a structure that dielectric rings 69 are fixed to at least two positions of an outer periphery of each contact probe 63 as shown in FIG. 9B, thereby to concentrically hold the contact probe in a through hole of a metal block with a gap. According to this structure, almost all parts of the dielectric substance between the contact probe as the core conductor and the inner face of the through hole of the metal block as the outer conductor can be formed to be an air layer having dielectric constant of 1. That is, it is possible to decrease the dielectric constant between the core conductor and the outer conductor of the coaxial structure, thereby to reduce a hole diameter of the through hole as compared with the contact probe having the same size, and hence, narrowing the pitch can be achieved.

However, in order to firmly hold the contact probe in the through hole by the dielectric rings, it is necessary to make outer diameters of the dielectric rings somewhat larger than the inner diameter of the through hole, and to forcibly push the contact probe with the dielectric rings into the through hole. The contact probe itself is in a shape of a very small pipe having an outer diameter of about 0.15 mm, and it is difficult to push it into the through hole. In this respect, there has been a problem that the contact probe is liable to be crooked with an external force, and even with a little crook, smooth movement of the plunger to be achieved by the spring within the pipe may be hindered. Moreover, in a case where the dielectric ring is made larger in width with a view to enhancing easiness in its insertion process and mechanical strength, the dielectric constant of the dielectric substance in the coaxial structure becomes larger, resulting in disturbance of the characteristic impedance, which will sacrifice the high frequency characteristics and high speed performance.

Meanwhile, Japanese Patent Publication No. 2004-325306A discloses a structure for holding such small contact probes in the through holes in the metal block as shown in FIG. 8A. In this structure, a metal block 2 and a metal plate 31 are formed with recessed parts, and insulative spacers 32 are inserted into the recessed parts concentrically with the through holes so that opposite ends of the contact probes 1 can be held by the insulative spacers 32. According to this structure, the contact probes 1 will hardly receive external forces, and can be held concentrically with the through holes 21 keeping gaps from the through holes, thereby to decrease the relative dielectric constant and to attain pitch narrowing.

However, this structure has also a problem that when the metal plate 31 is mounted after the contact probes 1 have been inserted, the contact probes 1 in the coaxial structure may be inclined, as shown in FIG. 8B, and a work for mounting the metal plate 31 is difficult because several hundreds of the contact probes including the contact probes for power supply and grounding are present within an area of a few cm$^2$, and each the contact probe in the coaxial structure has a diameter of about 0.15 mm and a length of a few millimeter.

SUMMARY OF THE INVENTION

It is therefore an object of the invention to provide an inspection unit which can perform highly reliable inspection without being affected by noises, employing contact probes of a coaxial structure which can be easily manufactured but are not so expensive, even in a case where an inspection is conducted with respect to a device for RF signals in which electrode terminals are arranged with a very narrow pitch as small as 0.4 mm.

In order to achieve the above object, according to the invention, there is provided an inspection unit, comprising:

a conductive member, having a first face adapted to be mounted on a board on which an inspection circuit is arranged and a second face adapted to be opposed to a device to be inspected, the conductive member being formed with a first through hole having a first diameter and communicating the first face with the second face;

a contact probe, comprising a tubular body having a second diameter which is smaller than the first diameter, and a plunger retractably projected from one end of the tubular body;

a first retainer, formed with a second through hole and opposing at least the second face of the conductive member so as to communicate the first through hole with the second through hole, so that the contact probe is retained in the conductive member while only the plunger is projected from one end of the second through hole; and a second retainer, adapted to retain the one end of the tubular body concentrically with the first through hole.

The second retainer may be an insulative sheet disposed between the conductive member and the first retainer, and having a hole through which the one end of the tubular body passes.

Alternatively, the second retainer may be an insulative annular member fitted with the tubular body and having a width which is no greater than a gap between an outer face of the tubular body and an inner face of the first through hole.

Further, the first retainer may comprise a conductive plate member having a third through hole, and an insulative spacer formed with the second through hole and fitted into the third through hole.

Alternatively, the first retainer may comprise an insulative plate member formed with the second through hole.

Further, the contact probe may be adapted to transmit an RF signal. Herein, the RF signal includes both an analogue high frequency signal, and a digital short pulse signal having a short pulse interval, in which repetitions of sine waves or pulses are at 1 GHz or more.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE EMBODIMENTS

Embodiments of the invention will be described with reference to the accompanying drawings.

Figure 1A:
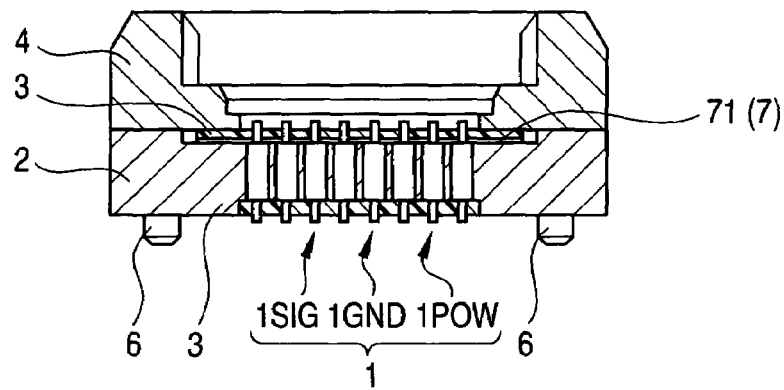
FIG. 1A is a section view of an inspection unit according to a first embodiment of the invention, showing an assembled state thereof.
Figure 1B:
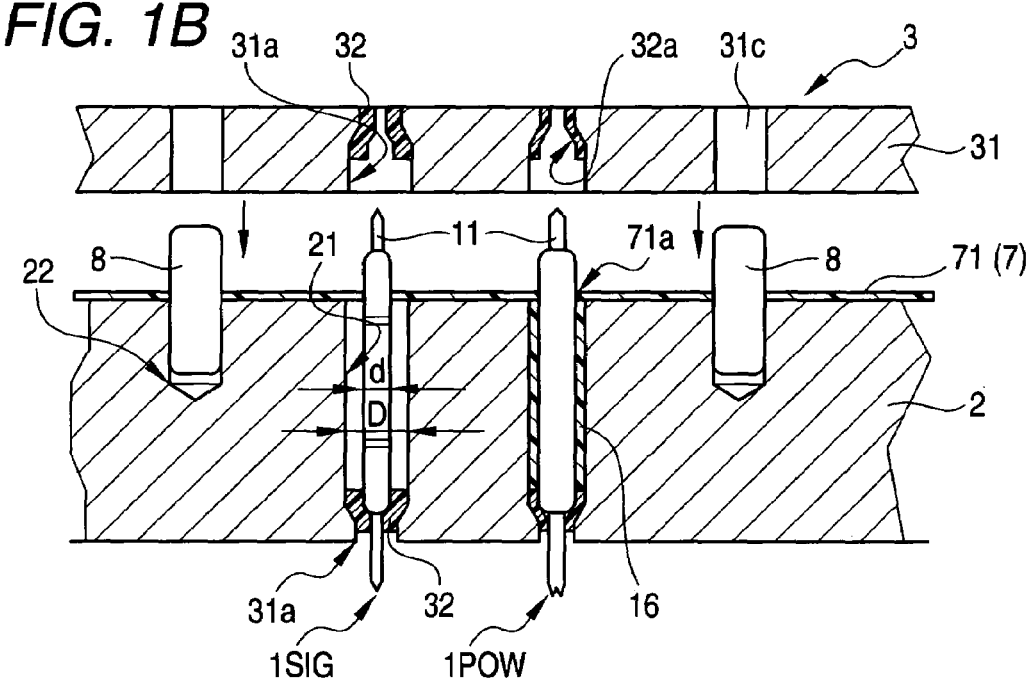
FIG. 1B is an enlarged section view of the inspection unit of FIG. 1A, showing a disassembled state thereof.

As shown in FIG. 1, an IC socket according to a first embodiment of the invention comprises a metal block 2 formed with through holes 21. Within one of the through holes 21, a contact probe 1SIG for RF signals is disposed while leaving a gap, so as to be a core conductor of a coaxial structure, and further, contact probes 1POW, 1GND for power supply and for grounding are respectively provided in other through holes 21 of the metal block 2. A first retainer 3 for fixing the contact probes 1SIG, 1POW, 1GND so as not to escape from the metal block 2, while only plungers 11 of the contact probes 1SIG, 1POW, 1GND are projected, is provided on one face of the metal block 2. There is further provided a second retainer 7 for holding tip ends of the contact probes 1SIG, 1POW, 1GND at positions to be opposed to through holes 31a for the plungers 11 formed in the first retainer 3.

In this embodiment, the contact probes 1 (1SIG, 1POW, 1GND) are fixed to the metal plate 2 by the first retainer 3, and a device guide plate 4 is mounted thereon. In this IC socket, the contact probes 1SIG, 1POW, 1GND are connected to an inspection board which is not shown, by positioning a plurality of positioning pins 6 provided on the metal block 2 in alignment with predetermined positions of the inspection board, and the IC or the like is inserted into a recess of the device guide plate 4 at the top, whereby electrode terminals of the IC or the like are connected to the contact probes 1 to execute the inspection.

Figure 1C:
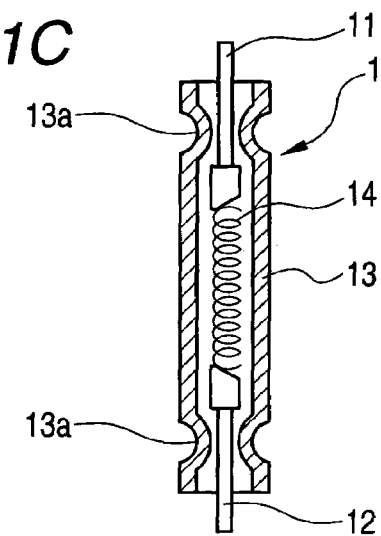
FIG. 1C is a section view of a contact probe in the inspection unit of FIG. 1A.

As shown in FIG. 1C, the contact probe 1 has such a structure that a spring 14 and one ends of the plungers 11, 12 are contained in a metal pipe 13, and the plungers 11, 12 are held so as not to escape from the metal pipe 13 by neck portions 13a formed in the metal pipe 13, and to be urged outwardly by the spring 14. When the tip ends of the plungers 11, 12 are pressed, the spring 14 will be contracted so that the tip ends may be pushed into the metal pipe 13, and while no force is applied, the tip ends of the plungers 11, 12 are projected by about 1 mm, for example. Although the plungers 11, 12 are provided at both ends of the contact probe, depending on the structure of an inspection unit, it may be sufficient that the plunger 11 is provided on at least one side of the contact probe which comes into contact with the device to be inspected.

The metal pipe 13 has a length of about a few millimeters and may be formed of nickel silver (copper, nickel, zinc alloy) for example. As the plungers 11, 12, a wire member having a diameter of about 0.1 mm and formed of SK material or beryllium copper may be used. The spring 14 may be formed of a piano wire or the like.

Although the contact probes 1 have substantially the same structure irrespective of their uses, namely, for signals, for power supply and for grounding, the contact probe 1SIG must be formed in a coaxial structure in combination with an inner wall of the through hole 21 of the metal block 2 which serves as the outer conductor, as described below. For this purpose, an outer diameter d of the contact probe 1SIG and an inner diameter D of the through hole 21 are determined so as to satisfy the above mentioned Equation (1). For example, in the case of the inspection unit in which the contact probes are arranged in a matrix manner with a pitch of 0.4 mm, the outer diameter d is set to be 0.15 mm, and the inner diameter D of the through hole 21 is set to be about 0.35 mm.

On the other hand, the contact probes 1POW, 1GND have preferably as large diameters as possible, and formed in such sizes to be inserted into the through holes 21 having substantially the same size as the through holes 21 which are formed for the RF signals, according to their pitch. In addition, the contact probe 1POW is covered with an insulative tube 16 having such a thickness that the contact probe 1POW may not make a short circuit with the metal block 2. Although not shown, the contact probe 1GND is also covered with a ground tube made of phosphor bronze, for the purpose of improving contact performance with the inner wall of the through hole 21.

The metal block 2 is intended to hold the contact probe 1SIG, the contact probe 1POW, and so on, which are brought into contact with the electrode terminals of the IC or module which is the device to be inspected. By forming the metal block 2 by metallic material such as aluminum or brass for example, it is possible to form the coaxial structure including the inner wall of the through hole 21 as the outer conductor and the contact probe 1SIG as the core conductor.

Thickness and dimension of the metal block 2 may vary depending on the type of inspection unit into which the metal block is incorporated, for example, an IC socket which simply interconnects the IC and the inspection board provided with wirings, or an inspecting tool connected to the inspection board to which a coaxial cable or the like is connected. However, in general cases, the metal block 2 is formed having a thickness of about 3 to 8 mm, and an area of 30 to 50 mm square.

The first retainer 3 comprises a metal plate 31 which is provided at one end side of the contact probes 1, that is, on one face of the metal block 2. The metal plate 31 is provided with through holes 31a into which the plungers 11 of the contact probes 1 are inserted. Each of the through holes 31a has a stepped part. The first retainer 3 further comprises an insulative spacer 32 formed with a through hole 32a which enables the plunger 11 to pass through and has a stepped part for fixing the contact probe 1 is fitted into the stepped part of the through hole 31a. Specifically, the first retainer 3 is constructed in such a manner that the stepped part of the insulative spacer 32 formed at a side opposed to the metal block 2 matches an outer shape of the metal pipe 13 of the contact probe 1, and the contact probe 1 can be fixed so as not to escape from the metal block 2, while retractably projecting the plunger 11.

The metal plate 31 is formed of aluminum or brass, and has a thickness of 1 to 2 mm. The insulative spacer 32 is formed of polyether imide (PEI), for example, and has a thickness of about 0.5 mm. Denoted with numeral 31c is a through hole for a positioning pin 8.

In this embodiment, a metal plate is not provided at the lower end side of the contact probes 1, but the through hole 31a having the stepped part is directly formed at the lower part of the metal block 2, and the insulative spacer 32 similar to the above described is inserted into the stepped part. However, the metal plate may be also disposed at the lower end side of the contact probes 1 so that the first retainer 3 which is similar to that of the upper end side may be also provided.

On the other hand, the second retainer 7 which will be described below may be provided only at the upper end side. This is because, while the lower ends of the contact probes are individually inserted into the insulative spacers 32 as a first step, and so, there is no problem in inserting the lower ends of the contact probes 1 without the second retainer 7 all of the many contact probes 1 arranged in parallel on the upper end side must be collectively inserted into the through holes 31a of the first retainer 3 in case of mounting of the metal plate 31. In this case, if the upper ends of the contact probes 1 are not aligned with their centers, but inclined, the plungers 11 are unable to be inserted into the through holes 31a of the first retainer 3. This must be prevented by providing the second retainer 7.

The second retainer 7 will keep the contact probes 1 substantially in upright positions so that they can be easily inserted into the through hole 31a of the first retainer 3. In the embodiment shown in FIG. 1, the second retainer 7 is an insulative sheet 71 provided on the surface of the metal block 2. The contact probe 1POW and the contact probe 1GND have substantially no clearance with respect to the through holes 21 and will not be inclined, because they are formed as large as possible as described above, and inserted into the through holes 21 with the insulative tube 16 or the contact ground tube covered thereon. On the contrary, the contact probes 1SIG are likely to be inclined, because only their lower ends are inserted into the insulative spacers 32, and the contact probes 1SIG are formed to have a determined relation with respect to the inner diameter of the through hole 21 with a gap therebetween. Besides, since the contact probes 1 are so many in number and may be inclined randomly, it is hardly possible to mount the metal plate 31. Under the circumstances, the insulative sheet 71 is provided so that the contact probes 1SIG may be substantially uprightly held.

The insulative sheet 71 is formed of insulative material such as polyimide, or polytetrafluoroethylene. The contact probes 1 are held only by the insulative sheet 71, until the metal plate 31 is attached to a surface of the insulative sheet 71. Therefore, it would be sufficient that the insulative sheet 71 has such rigidity as capable of holding the contact probes 1, so as not to be inclined. For this purpose, in the case of the contact probe having a diameter of 0.3 mm for example, the insulative sheet 71 having a thickness of about 75 μm would be sufficient. The insulative sheet 71 is provided with holes 71a having such diameters as corresponding to the diameters of the contact probes 1 and the positioning pins 8, at respective positions corresponding to the contact probes 1 and the positioning pins 8. By positioning the insulative sheet 71 with the positioning pins 8, the contact probes 1 will be correctly aligned, in position, with the holes 71a of the insulative sheet 71.

On occasion of actually assembling, the positioning pins 8 are inserted into positioning holes 22 in the metal block 2, and the insulative sheet 71 is attached to the surface of the metal block 2 in alignment with the positioning pins 8. Then, predetermined contact probes 1 are inserted into respective predetermined through holes 21 at the determined positions. By mounting the metal plate 31 thereafter, because the contact probes 1SIG are almost uprightly standing, the respective plungers 11 of the contact probes 1 are projected through the through holes 32a of the insulative spacers 32 provided in the metal plate 31, and thus, the IC socket can be easily assembled.

Figure 2:
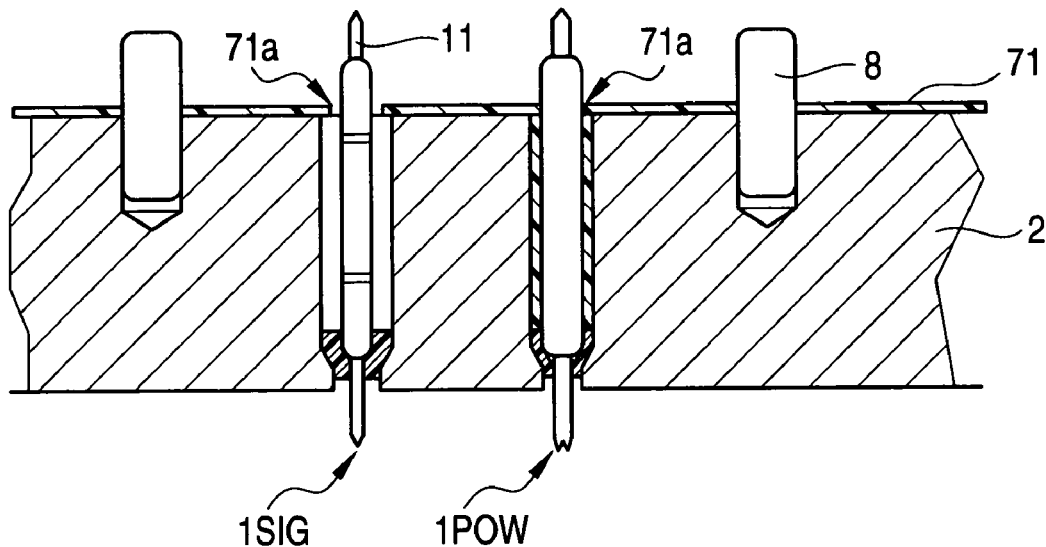
FIG. 2 is an enlarged section view of a modified example of the inspection unit of FIG. 1A, showing a disassembled state thereof.

In this case, even though the holes 71a formed in the insulative sheet 71 do not completely match the respective diameters of the contact probes 1, the plunger 11 of the contact probe 1SIG will not be extremely inclined inside the hole, provided that the hole has been formed so as to match the larger holes for the contact probe 1POW or 1GND, as shown in FIG. 2 for example. Moreover, because recessed parts of the first retainer 3 are so formed as to become gradually smaller, almost no trouble may occur in the assembling work.

Figure 3:
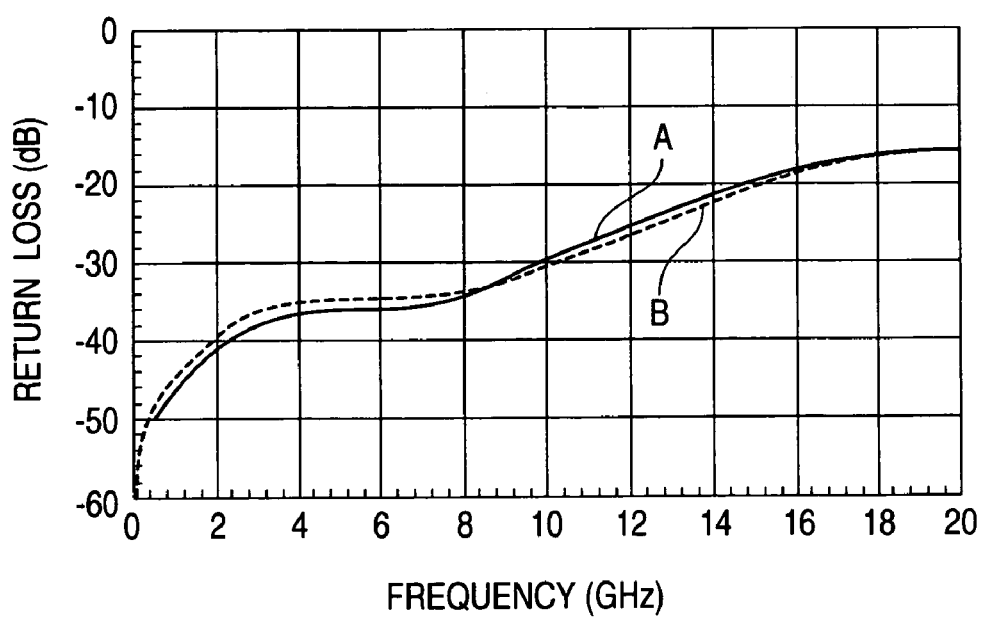
FIG. 3 is a graph for explaining a return loss characteristics of the inspection unit of FIG. 1A.

Although the contact probe 1 is preferably covered with the metal block 2 which is grounded, for shutting off noises from the exterior, it is confirmed that use of insulative sheet 71 causes almost no trouble in terms of electric performance. To prove this, return loss characteristics was simulated through electromagnetic field analysis, both in a case A wherein the insulative sheet 71 formed of polyimide and having a thickness of 75 μm is provided and in a case B wherein the insulative sheet 71 is not provided. The results are shown in FIG. 3. There was recognized almost no difference in the return loss characteristics between both the cases. It is considered that the insulative sheet 71 having such thickness would not serve as an insulative body in terms of RF signal, but the metal block 2 and the metal plate 31 would act as if they are electrically connected. The simulation was conducted in a structure that the contact probes 1GND were arranged around the contact probe 1SIG.

Next, a second embodiment of the invention will be described. Components similar to those in the first embodiment will be designated by the same reference numerals and repetitive explanations for those will be omitted.

Figure 4:
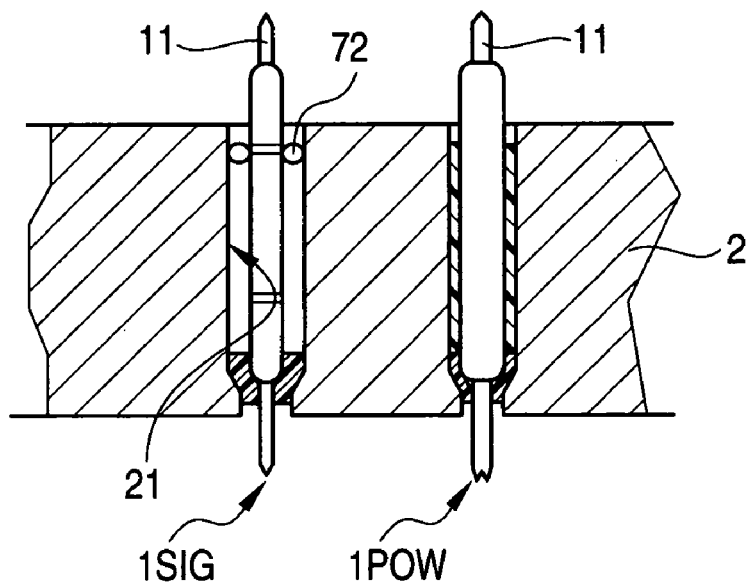
FIG. 4 is an enlarged section view of an inspection unit according to a second embodiment of the invention, showing a disassembled state thereof.

In this embodiment, as shown in FIG. 4, instead of using the insulative sheet an insulative ring 72 in a shape of an O-ring formed of resin such as silicone rubber or PEI (polyether imide) is inserted at one end side of the contact probe 1SIG. This insulative ring 72 is not intended to fix the contact probe concentrically with the through hole 21 of the metal block 2, but simply hold the contact probe 1 so as not to be inclined. Besides, the contact probe itself has a length of only a few millimeters, and so, almost no mechanical strength is required. Moreover, it would be sufficient that the insulative ring 72 has a diameter of 0.1 mm to 0.2 mm as large as the gap between the contact probe 1SIG and the inner wall of the through hole 21. Return loss characteristics in a case where this insulative ring 72 is provided was simulated in the same manner. The results are shown in FIG. 5.

Figure 5:
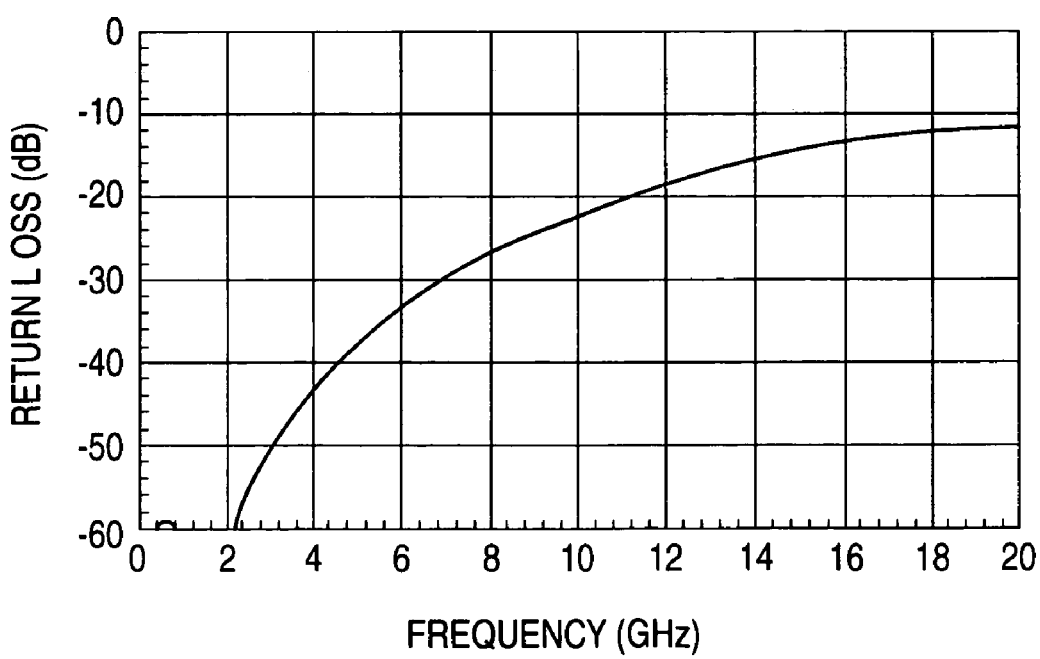
FIGS. 5 and 6A are graphs for explaining a return loss characteristics of the inspection unit of FIG. 4.

As apparent from FIG. 5, as compared with the case B where the insulative sheet is not provided as shown in FIG. 3 (in a case where inclination is not prevented), the return loss was somewhat increased in a region of high frequency. Nevertheless, the return loss below −15 dB would not hinder the inspection, and can deal with the RF up to 15 GHz or so. In short, there is no problem as the inspection unit for the ordinary RF device. In this examination of the characteristics, positions of the insulative ring 72 were changed to examine the return losses in the respective positions. Specifically, the similar return losses were examined in three cases, namely, where the insulative ring 72 was at a position in contact with the surface of the metal block 2 (0 mm), at a position of 0.2 mm deep into the metal block from the 0 mm position, and at a position of 0.4 mm deep into the metal block. They are represented by a single line of data in FIG. 5, because the data were substantially the same in all the cases.

Figure 6A:
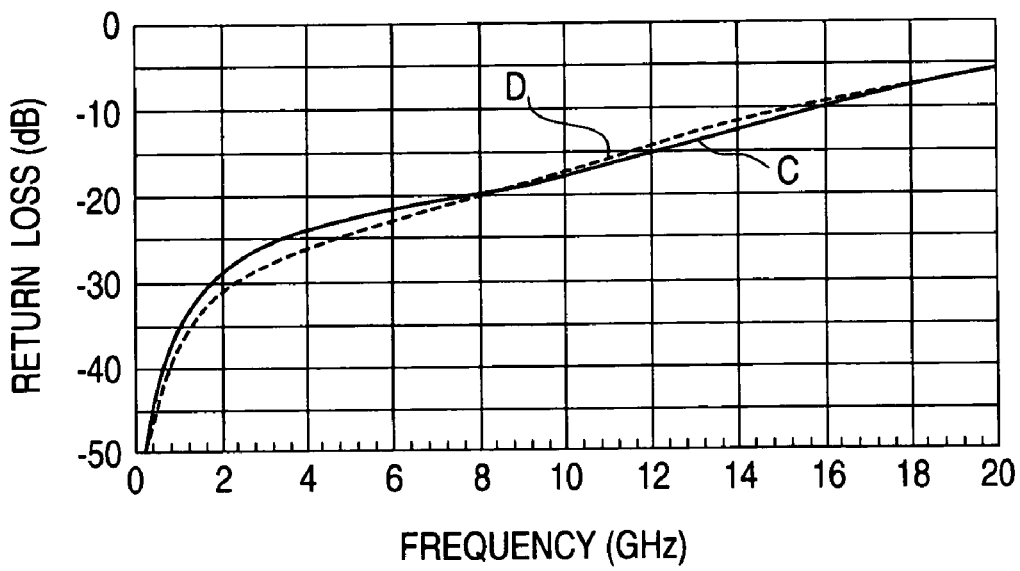
Figure 6B:
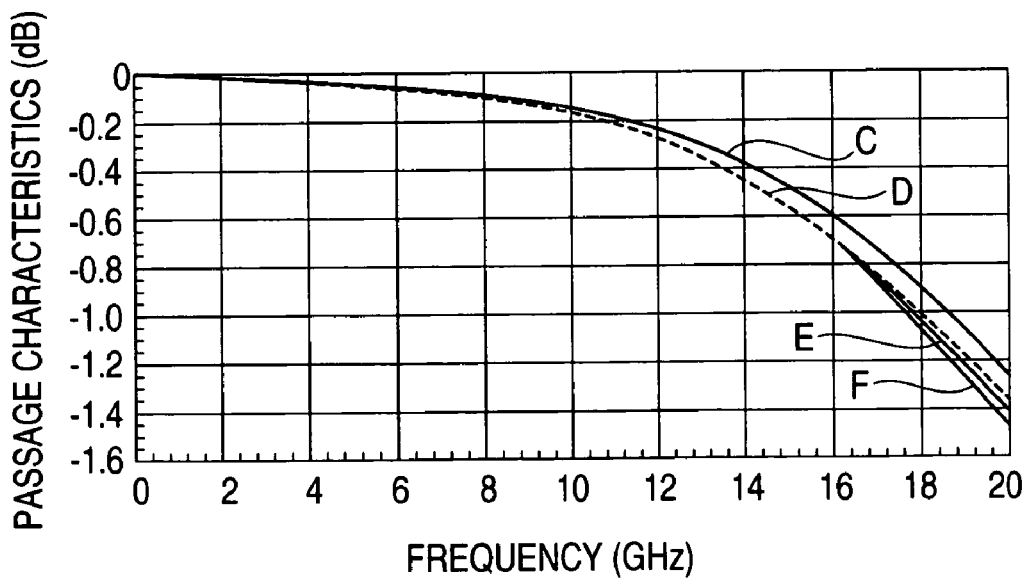
FIG. 6B is a graph for explaining a passage characteristics of the inspection unit of FIG. 4.

Further, return loss and passage characteristics were simulated, provided that the outer diameter of the contact probe 1 is 0.2 mm and the inner diameter of the through hole 21 is 0.43 mm, in a case C where the insulative ring was not provided, in a case D where the insulative ring was provided at the position of 0 mm, in a case E where the insulative ring was provided at the position of 0.2 mm, and in a case F where the insulative ring was provided at the position of 0.4 mm. The results are shown in FIG. 6. Also in this case, the return losses were almost the same data even though the positions of the insulative ring have been changed, and so, there are shown only the cases C and D.

It is apparent from FIG. 6 that the passage characteristic was slightly deteriorated at the frequency above 16 GHz, as the insulative ring becomes deeper into the metal block, but there was no significant difference. Therefore, the passage characteristic is hardly deteriorated depending on the provision of the insulative ring and its position. In other words, the passage characteristic will not at all be influenced, even though the insulative ring is somewhat deviated in position, on occasion of inserting the contact probe.

Next, a third embodiment of the invention will be described. Components similar to those in the first embodiment will be designated by the same reference numerals and repetitive explanations for those will be omitted.

Figure 7:
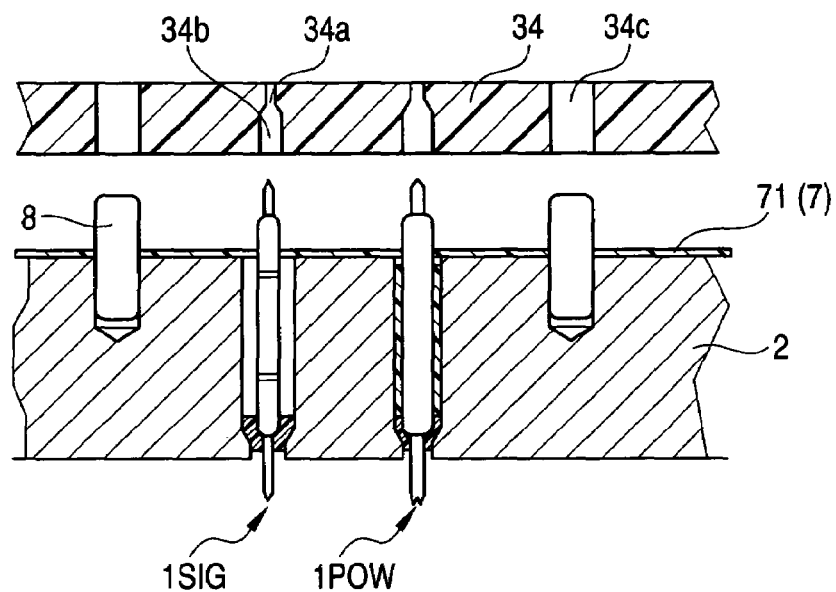
FIG. 7 is an enlarged section view of an inspection unit according to a third embodiment of the invention, showing a disassembled state thereof.
Figure 8A:
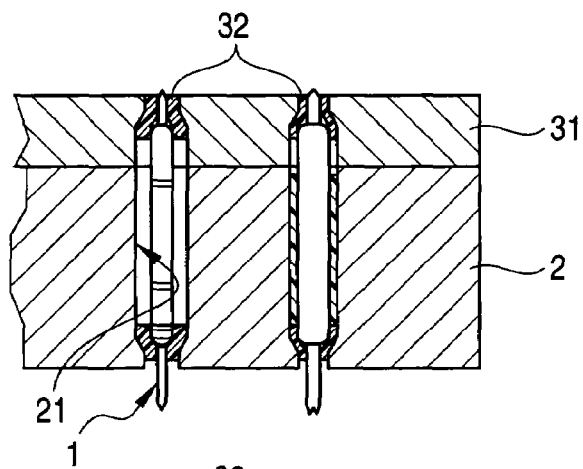
FIG. 8A is an enlarged section view of a first conventional inspection unit, showing an assembled state thereof.
Figure 8B:
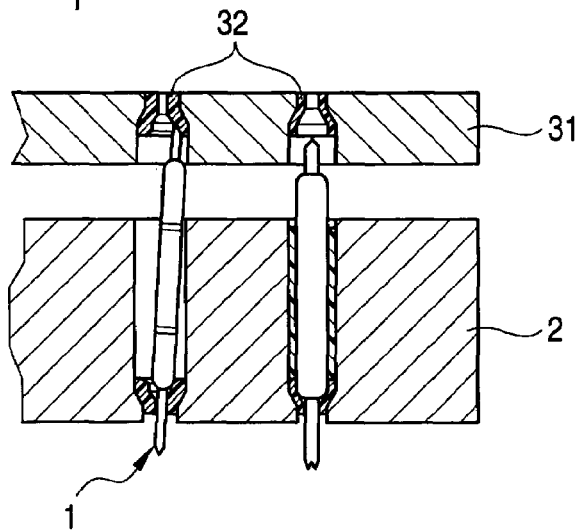
FIG. 8B is an enlarged section view of the first conventional inspection unit, showing a disassembled state thereof.
Figure 9A:
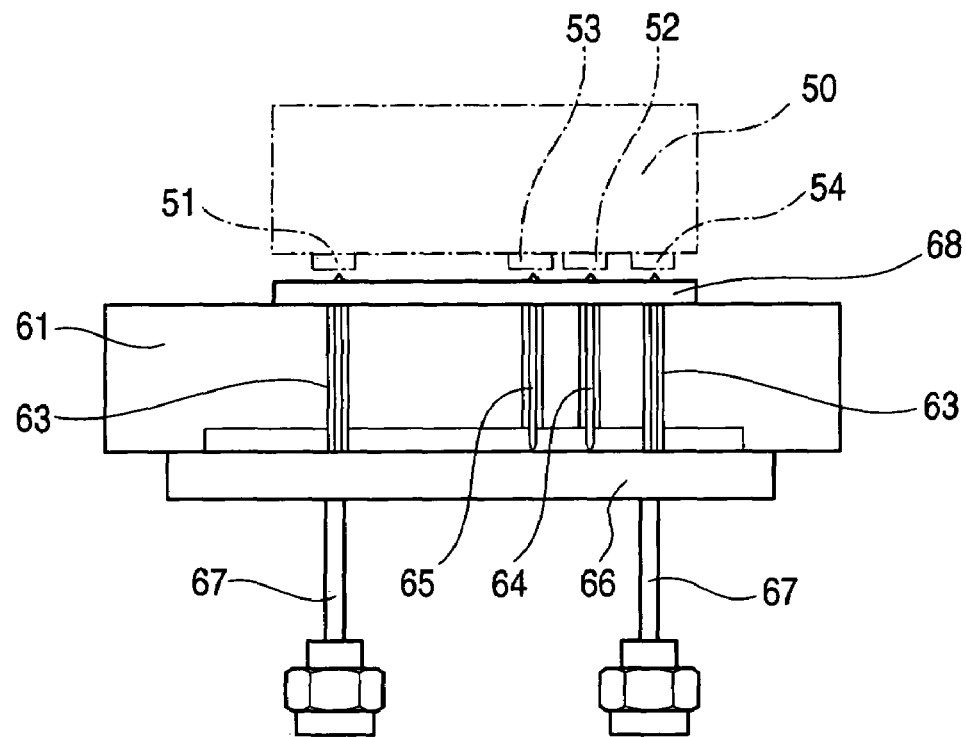
FIG. 9A is a schematic section view of a second conventional inspection unit.
Figure 9B:
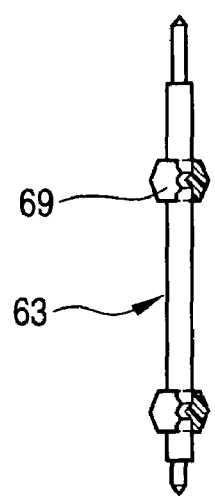
FIG. 9B is a partial section view of a contact probe in the second conventional inspection unit.

As shown in FIG. 7, in this embodiment, an insulative board 34 formed with through holes 34a and recessed parts 34b is employed, instead of using the metal plate. The insulative board 34 formed of polyether imide (PEI) for example would be preferably employed, because it is possible to form the recessed parts 34b and the through holes 34a by resin molding, more easily and with accurate sizes, even in a case where a number of the contact probes are arranged in parallel at a narrow pitch. Moreover, the above described resin has such a large mechanical strength that deflection may not occur when formed in a thickness of about 1 mm, and can secure the contact probes very stably, even in a case where several hundreds or more contact probes are present. However, other materials can be also employed, provided that they are electrically insulative and thin, but have mechanical strength. Denoted with numeral 34c are through holes for the positioning pins 8.

Further, even in a case where the other end sides of the contact probes are directly fixed by soldering to the inspection board or the like instead of employing the plunger structure as described above, it is possible, by providing the above described second retainer, to conduct soldering, after the contact probes 1 have been inserted and the first retainer 3 such as the metal plate has been assembled, and hence, workability will be improved.

Although the present invention has been shown and described with reference to specific preferred embodiments, various changes and modifications will be apparent to those skilled in the art from the teachings herein. Such changes and modifications as are obvious are deemed to come within the spirit, scope and contemplation of the invention as defined in the appended claims.

What is claimed is:

1. An inspection unit, comprising:
    a conductive member, having a first face adapted to be mounted on a board on which an inspection circuit is arranged and a second face adapted to be opposed to a device to be inspected, the conductive member being formed with a first through hole having a first diameter and communicating the first face with the second face;
    a contact probe, comprising a tubular body having a second diameter which is smaller than the first diameter, and a plunger retractably projected from one end of the tubular body;
    a first retainer, formed with a second through hole and opposing at least the second face of the conductive member so as to communicate the first through hole with the second through hole, so that the contact probe is retained in the conductive member while only the plunger is projected from one end of the second through hole; and
    a second retainer, adapted to retain the one end of the tubular body concentrically with the first through hole.

2. The inspection unit as set forth in claim 1, wherein the second retainer is an insulative sheet disposed between the conductive member and the first retainer, and having a hole through which the one end of the tubular body passes.

3. The inspection unit as set forth in claim 1, wherein the second retainer is an insulative annular member fitted with the tubular body and having a width which is no greater than a gap between an outer face of the tubular body and an inner face of the first through hole.

4. The inspection unit as set forth in claim 1, wherein the first retainer comprises a conductive plate member having a third through hole, and an insulative spacer formed with the second through hole and fitted into the third through hole.

5. The inspection unit as set forth in claim 1, wherein the first retainer comprises an insulative plate member formed with the second through hole.

6. The inspection unit as set forth in claim 1, wherein the contact probe is adapted to transmit an RF signal.

* * * * *